(12) United States Patent
Bang

(10) Patent No.: US 7,813,207 B2
(45) Date of Patent: Oct. 12, 2010

(54) FUSE BOX AND SEMICONDUCTOR MEMORY DEVICE INCLUDING THE SAME

(75) Inventor: Kwang-Kyu Bang, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/327,985

(22) Filed: Dec. 4, 2008

(65) Prior Publication Data

US 2009/0141578 A1   Jun. 4, 2009

(30) Foreign Application Priority Data

Dec. 4, 2007   (KR) .............................. 2007-125003

(51) Int. Cl.
   *G11C 7/00*   (2006.01)
(52) U.S. Cl. .................... 365/225.7; 365/200
(58) Field of Classification Search .............. 365/225.7, 365/200

See application file for complete search history.

(56) References Cited

U.S. PATENT DOCUMENTS 5,703,824 A * 12/1997 Isa ........................... 365/225.7
6,067,268 A * 5/2000 Lee .......................... 365/225.7
6,215,173 B1   4/2001 Echigoya
6,556,490 B2 * 4/2003 Shubat et al. ............... 365/200
6,682,959 B2   1/2004 Bang et al.

FOREIGN PATENT DOCUMENTS

| JP | 05251563 | 9/1993 |
|----|----------|--------|
| JP | 2000150821 | 5/2000 |
| KR | 1020000035362 | 6/2000 |
| KR | 1020050002072 | 1/2005 |
| KR | 100668868 | 1/2007 |

* cited by examiner

*Primary Examiner*—Son Dinh
(74) *Attorney, Agent, or Firm*—F. Chau & Associates, LLC

(57) ABSTRACT

A fuse box of a semiconductor memory device which comprises a plurality of fuse units commonly connected to a power line, each of the fuse units comprising a first fuse connected with the power line; and a plurality of second fuses connected with the first fuse in parallel. If the second fuses are determined to be cut off, the first fuse is cut off instead of the second fuses.

15 Claims, 14 Drawing Sheets

FUSE BOX AND SEMICONDUCTOR MEMORY DEVICE INCLUDING THE SAME

CROSS-REFERENCE TO RELATED PATENT APPLICATIONS

This U.S. application claims priority under 35 U.S.C §119 to Korean Patent Application No. 10-2007-0125003 filed on Dec. 4, 2007 in the Korean Intellectual Property Office, the disclosure of which is hereby incorporated by reference.

BACKGROUND OF THE INVENTION

1. Technical Field

The present disclosure relates to a semiconductor memory device, and more particularly, to a fuse box of the semiconductor memory device.

2. Discussion of the Related Art

Semiconductor memory devices can be classified into Random Access Memory (RAM) devices and Read Only Memory (ROM) devices. RAM devices are volatile memory devices where stored data are lost if a power supply is turned off. ROM devices are nonvolatile memory devices where stored data are retained even if a power supply is turned off. RAM devices comprise Dynamic RAM (DRAM) devices, Static RAM (SRAM) devices, etc. ROM devices comprise Programmable ROM (PROM) devices, Erasable PROM (EPROM) devices, Electrically EPROM (EEPROM) devices, flash memory devices, etc. Flash memory devices can be classified into NOR type devices and NAND type devices.

A defective cell which doesn't operate normally may exist on a memory cell array of a semiconductor memory device due to an error during a fabrication process. A semiconductor memory device includes a redundant cell array and a redundant selection circuit for replacing defective cells. Addresses of the defective cells are stored in the redundant selection circuit. When an address is transmitted from an exterior, the redundant selection circuit compares the transmitted address with the stored addresses in the redundant selection circuit. If the transmitted address is identical to one of the stored addresses, identical access is requested to a defective cell, the redundant selection circuit generates a redundant flag signal, and the redundant cell array is selected instead of the defective cell in the memory cell array.

To remove the defective cells from the memorial cell array and to replace them with redundant cells, fuse circuits are provided to route the connection from the defective cells to the redundant cells.

Addresses of defective cells are stored in a fuse box. Each fuse corresponds to an address of a defective memory cell.

SUMMARY OF THE INVENTION

One aspect of the present invention is directed to a fuse box of a semiconductor memory device, which comprises a plurality of fuse units connected with a power line commonly, each of the fuse units comprising a first fuse connected with the power line; and a plurality of second fuses connected with the first fuse in parallel. If the second fuses are determined to be cut off, the first fuse is cut off instead of the second fuses. Another aspect of the present invention is directed to a semiconductor memory device, which comprises a memory cell array having a normal cell array and a redundant cell array; and a redundant selection circuit configured to receive an address from an exterior and to select the redundant cell array if the received address indicates the defected cells. The redundant selection circuit comprises a plurality of fuse boxes for storing addresses of the defected cells, wherein each of the fuse boxes comprises a plurality of fuse units connected with a power line commonly. Each of the fuse units comprises a first fuse connected with the power line; and a plurality of second fuses connected with the first fuse in parallel. If the second fuses are determined to be cut off, the first fuse is cut off instead of the second fuses.

BRIEF DESCRIPTION OF THE DRAWINGS

Embodiments of the present invention will be described with reference to the following drawings, wherein the same reference numerals refer to same or similar parts throughout the various drawings unless otherwise specified.

DETAILED DESCRIPTION OF EXEMPLARY EMBODIMENTS

Figure 1:
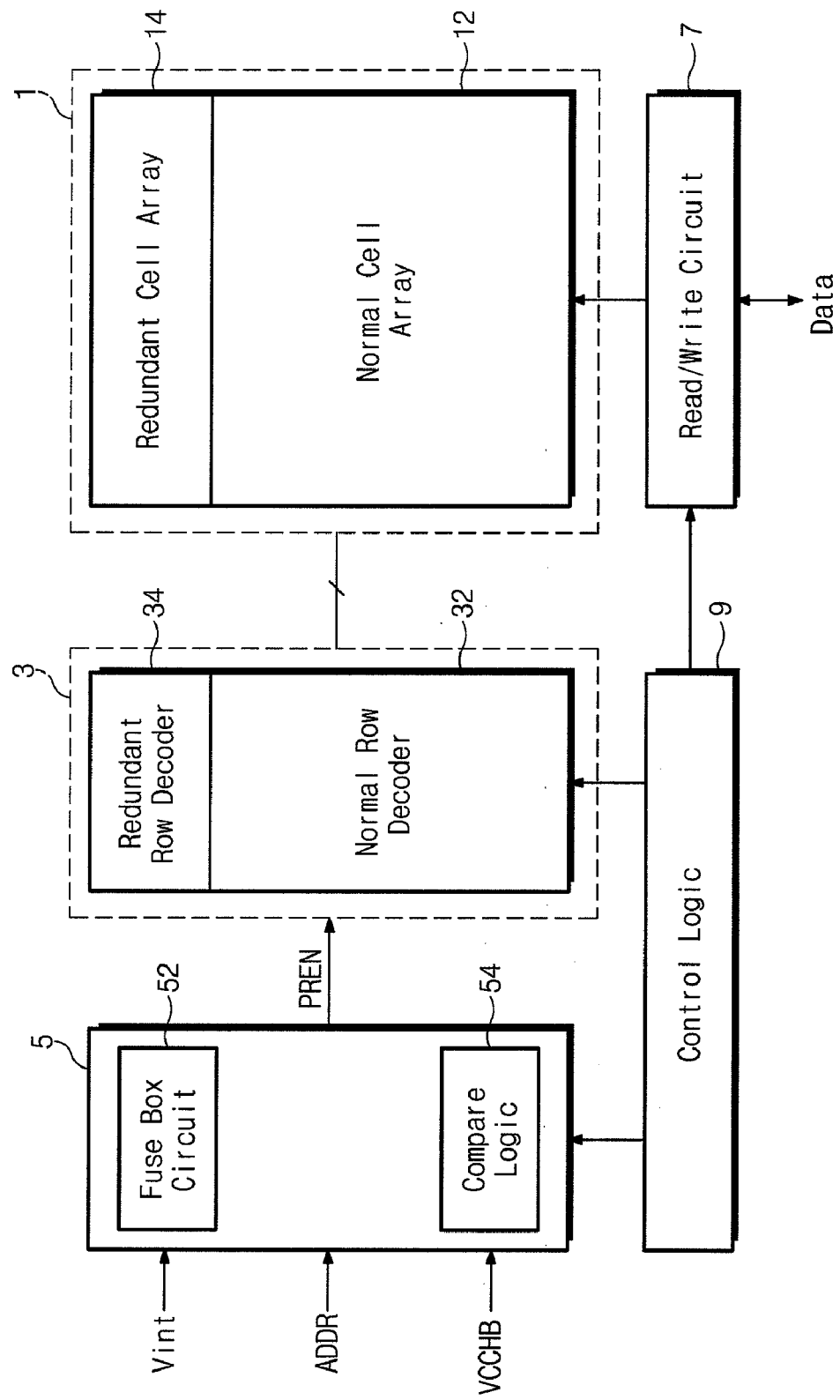
FIG. 1 is a block diagram illustrating a semiconductor memory device according to an embodiment of the present invention.

Exemplary embodiments of the present invention will be described below in more detail with reference to the accompanying drawings, showing a flash memory device as an example for illustrating structural and operational features by the invention. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. The same reference numerals may refer to same or similar elements throughout the accompanying figures.

A fuse box according to an embodiment of the present invention comprises a first fuse connected to a power line and a plurality of second fuses connected to the first fuse in parallel. In the case that the second fuses are determined to be cut off (or, have to be cut off), the first fuse is cut off instead of the second fuses. Thus, time for cutting operations of fuses is decreases.

Preferred embodiments of the present invention will be described below in more detail with reference to the accompanying drawings for those skilled in the art to embody the technical scope of the present invention without difficulty.

FIG. 1 is a block diagram illustrating a semiconductor memory device according to an embodiment of the present invention. Referring to FIG. 1, the semiconductor memory device according to an embodiment of the present invention comprises a memory cell array 1, a row decoder 3, a redundant selection circuit 5, a read/write circuit 7 and a control logic 9.

The memory cell array 1 is connected with the row decoder 3 and the read/write circuit 7. The memory cell array 1 comprises a normal cell array 12 and a redundant cell array 14. Each of the normal cell array 12 and the redundant cell array 14 comprises a plurality of rows and columns. Memory cells are formed at intersectional regions of the rows and columns, respectively. The rows of the normal cell array 12 and the redundant cell array 14 are connected with the row decoder 3. The columns of the normal cell array 12 and the redundant cell array 14 are connected with the read/write circuit 7.

The row decoder 3 is connected with the memory cell array 1, the redundant selection circuit 5 and the control logic 9. The row decoder 3 receives a redundant flag signal PREN from the redundant selection circuit 5. The row decoder 3 selects the rows of the memory cell array 1 in response to a control of the control logic 9. The row decoder 3 comprises a normal row decoder 32 and a redundant row decoder 34. If the redundant flag signal PREN is activated, the redundant row decoder 32 selects the rows of the redundant cell array 14 under a control of the control logic 9. If the redundant flag signal PREN is deactivated, the normal row decoder 32 selects the rows of the normal cell array 12 under a control of the control logic 9.

The redundant selection circuit 5 is coupled between the row decoder 3 and the control logic 9. The redundant selection circuit 5 operates in response to a control of the control logic 9. The redundant selection circuit 5 accepts address ADDR, a power Vint and a power-on reset signal VCCHB. The power-on reset signal VCCHB is input to the redundant selection circuit 5 if a power supply voltage supplied to the semiconductor memory device reaches a target voltage after initiating supplying of a power to the semiconductor memory device. The redundant selection circuit 5 is initialized when the power-on reset signal VCCHB is provided. The redundant selection circuit 5 comprises a fuse box circuit 52 and a compare logic 54. Addresses of defective memory cells are stored in the fuse box circuit 52. The fuse box circuit 52 includes a plurality of laser fuses being cut off by a laser. An exemplary structure of the laser fuses and an exemplary method for fabricating the laser fuses are disclosed in U.S. Pat. No. 6,682,959 entitled "ARCHITECTURE OF LASER FUSE BOX OF SEMICONDUCTOR INTEGRATED CIRCUIT AND METHOD FOR FABRICATING THE SAME", which is incorporated by reference herein. By selectively cutting off the laser fuses in the fuse box circuit 52, the redundant memory cell array is selected. The addresses of the defective memory cells are stored into the fuse box circuit 52.

The compare logic 54 compares the address ADDR with the addresses of the defective memory cells stored in the fuse box circuit 52. If the address ADDR is the same as one of the addresses of the defective memory cells stored in the fuse box circuit 52, the redundant selection circuit 5 generates the redundant flag signal PREN. The redundant flag signal PREN is transmitted to the row decoder 3.

The read/write circuit 7 is coupled between the memory cell array 1 and the control logic 9. The read/write circuit 7 operates in response to a control of the control logic 9. The read/write circuit 7 exchanges data with an exterior. If data to be written into the memory cell array 1 are transmitted, the read/write circuit 7 selects the rows of the memory cell array 1 in response to a control of the control logic 9. The read/write circuit 7 writes the transmitted data into memory cells of the selected rows. The read/write circuit 7 selects the rows of the memory cell array 1 in response to a control of the control logic 9 during reading data. The read/write circuit 7 reads data from memory cells of the selected rows and transmits the read data to the exterior.

The control logic 9 is connected to the row decoder 3, the redundant selection circuit 5 and the read/write circuit 7. The control logic 9 controls operations of the semiconductor memory device.

If a portion of memory cells of the memory cell array 12 is defective, addresses of cells determined as defective are stored into the fuse box circuit 52. A test for detecting the defective memory cells is performed when the semiconductor memory device is produced. Addresses of cells determined as defected cells by the test are stored into the fuse box circuit 52.

The address ADDR is transmitted to the redundant selection circuit 5 when data are written into or read from the memory cell array 1. The redundant selection circuit 5 compares the transmitted address ADDR with the addresses of the defective cells stored in the fuse box circuit 52. If the transmitted address ADDR is different from the addresses of the defective cells stored in the fuse box circuit 52, the redundant selection circuit 5 deactivates the redundant flag signal PREN. If the redundant flag signal is deactivated, the normal row decoder 32 selects the rows of the normal cell array 12 in response to a control of the control logic 9. The read/write circuit 7 selects the columns of the normal cell array 12 in response to a control of the control logic 9. That is, data are written into or read from the normal cell array 12.

If the transmitted address ADDR is the same as one of the addresses of the defective cells stored in the fuse box circuit 52, the redundant selection circuit 5 activates the redundant flag signal PREN. If the redundant flag signal PREN is activated, the redundant row decoder 34 selects the rows of the redundant cell array 14 in response to a control of the control logic 9. That is, data are written into or read from the redundant cell array 14.

Thus, when the semiconductor memory device is produced, a test for detecting the defective cells is performed. The addresses of the defective cells are stored into the fuse box circuit 52. If an address for writing data into or reading data from the defective cell is transmitted, the redundant selection circuit 5 activates the redundant flag signal PREN. If the redundant flag signal PREN is activated, the redundant cell array 14 is selected instead of the normal cell array 12. Thus, data are written into or read from the redundant cell array 14.

Figure 2:
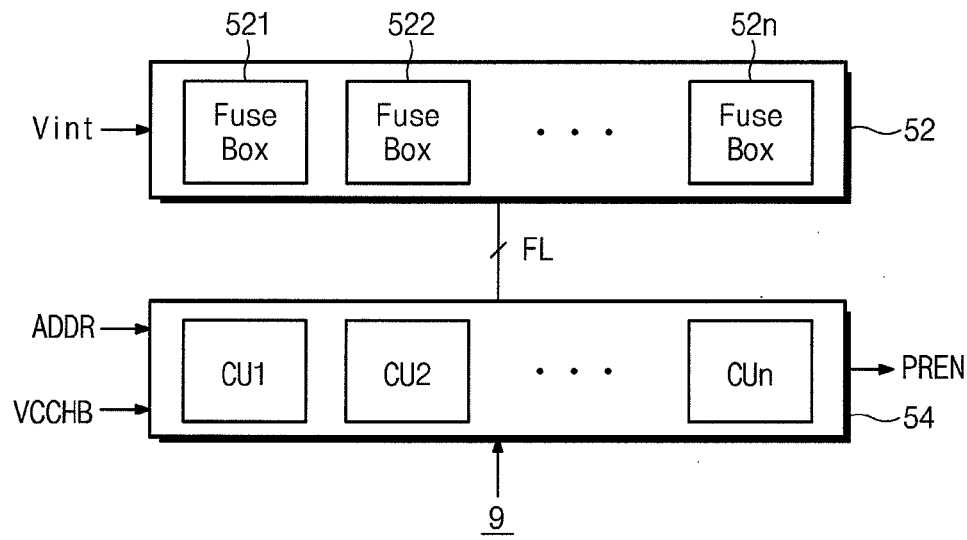
FIG. 2 is a block diagram illustrating the redundant selection circuit 5 shown in FIG. 1.

FIG. 2 is a block diagram illustrating the redundant selection circuit 5 shown in FIG. 1. Referring to FIG. 2, the redundant selection circuit 5 comprises the fuse box circuit 52 and the compare logic 54. The fuse box circuit 52 is provided with the power Vint. The fuse box circuit 52 includes a plurality of fuse boxes 521 to 52n. Each of the fuse boxes 521 to 52n stores the addresses of two or more of the defective cells. The fuse boxes 521 to 52n include a plurality of fuses respectively. The plurality of fuses of each of the fuse boxes 521 to 52n are connected between a power line provided with the power Vint and fuse lines FL. That is, the power Vint is transmitted to one of the fuse lines FL through a corresponding fuse when the corresponding fuse is not cut off. The power Vint is not transmitted to one of the fuse lines FL through the corresponding fuse if the corresponding fuse is cut off.

The compare logic 54 receives the address ADDR and the power-on reset signal VCCHB from an exterior. The compare logic 54 compares the received address ADDR with the addresses of the defective cells each stored in the fuse boxes 521 to 52n in response to the control logic 9 shown in FIG. 1. If the received address ADDR is the same as one of the addresses of the defective cells stored in the fuse boxes 521 to 52n, the compare logic 54 activates the redundant flag signal PREN.

The compare logic 54 includes a plurality of compare units CU1 to CUn. The number of the compare units CU1 to CUn is the same as the number of the fuse boxes 521 to 52n. Each of the compare units CU1 to CUn corresponds to each of the fuse boxes 521 to 52n. Each of the compare units CU1 to CUn compares the received address ADDR with the addresses each stored in corresponding fuse boxes.

Figure 3:
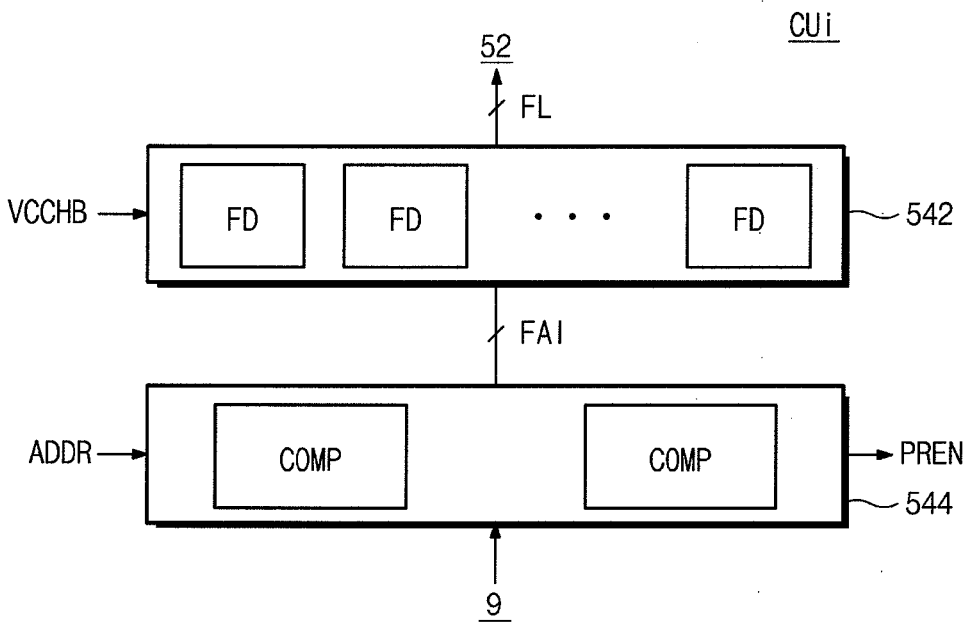
FIG. 3 is a block diagram illustrating one of the compare units CU1 to CUn shown in FIG. 2.

FIG. 3 is a block diagram illustrating one of the compare units CU1 to CUn shown in FIG. 2. Referring to FIG. 3, the compare unit CUi according to an embodiment of the present invention comprises a fuse decoding unit 542 and a fuse compare unit 544. The fuse decoding unit 542 is connected with the corresponding fuse box through the fuse lines FL. The fuse decoding unit 542 receives the power-on reset signal VCCHB. The fuse decoding unit 542 provides the fuse compare unit 544 with fuse address information signals FAI. The fuse decoding unit 542 includes fuse decoders FD of which number is the same as the number of the fuse lines FL. Each of the fuse decoders FD is connected to each of the fuse lines FL. Each of the fuse decoders FD determines whether the corresponding fuse should be cut off and generates the fuse address information signal FAI indicating whether the corresponding fuse is cut off.

The fuse compare unit 544 receives the fuse address information signals FAI from the fuse decoding unit 542. The fuse compare unit 544 compares the address ADDR transmitted from the exterior with the fuse address information signals FAI in response to a control of the control logic 9. If the address ADDR transmitted from the exterior is the same as one of the fuse address information signals FAI, the fuse compare unit 544 generates the redundant flag signal PREN.

The fuse compare unit 544 includes a plurality of comparators COMP. The number of the comparators COMP is the same as the number of addresses stored in each of the fuse boxes 521 to 52n. Each of the comparators COMP corresponds to each of the addresses stored in the fuse box. Each of the comparators COMP receives the fuse address information signals FAI from the fuse decoders FD. Each of the comparators COMP compares the address ADDR transmitted from the exterior with the received fuse address information signals FAI.

If two addresses of the defective cells are stored in one fuse box, the fuse compare unit 544 may include two comparators COMP as shown in FIG. 3. Although the fuse compare unit 544 including two comparators COMP is shown in FIG. 3, the number of the comparators COMP according to the present invention is not restricted.

Figure 4:
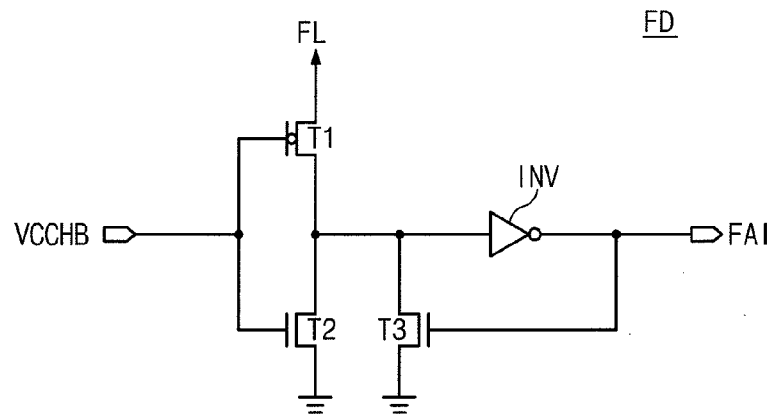
FIG. 4 is a schematic diagram illustrating one of the fuse decoders FD shown in FIG. 3.

FIG. 4 is a schematic diagram illustrating one of the fuse decoders FD shown in FIG. 3. Referring to FIG. 4, the fuse decoder FD comprises transistors T1 to T3 and an inverter INV. The transistor T1 is connected with the fuse line FL. The transistor T2 is connected between the transistor T1 and a ground voltage node. The transistors T1 and T2 operate in response to the power-on reset signal VCCHB. An input node of the inverter INV is connected between the transistors T1 and T2. The transistor T3 is connected between the input node of the inverter INV and the ground voltage node. The transistor T3 operates in response to an output of the inverter INV. The output of the inverter INV is used as the fuse address information signal FAI.

After turning on the semiconductor memory device, the power supply voltage increases. If the power supply voltage reaches a target voltage, the power-on reset signal VCCHB is activated. For example, the power-on reset signal VCCHB transits from logic low to logic high. And then, the transistor T1 is turned off, so that the fuse line FL floats. The transistor T2 is turned on, so that the input node of the inverter INV is electrically connected with the ground voltage node through the transistor T2. The output of the inverter INV is logic high, so that the input node of the inverter INV also is electrically connected with the ground voltage node through the transistor T3. And then, the power-on reset signal VCCHB transits from logic high to logic low. The transistor T2 is turned off and the transistor T1 is turned on. That is, the fuse line FL is connected with the input node of the inverter INV through the transistor T1.

If the fuse line FL is provided with the power Vint shown in FIG. 2, in other words, if the fuse connected to the fuse line FL is not cut off, the power Vint may be transmitted to the input node of the inverter INV through the transistor T1. And then, the output of the inverter INV transits to logic low and the transistor T3 is turned off. That is, the fuse address information signal FAI may be maintained as logic low.

If the fuse line FL is not provided with the power Vint, in other words, if the fuse connected with the fuse line FL is cut off, the input node of the inverter INV is electrically connected with the ground voltage node through the transistor T3. Thus, the fuse address information signal FAI may be maintained as logic high.

In other embodiments of the present invention, if the power supply voltage reaches the target voltage, the power-on reset signal VCCHB may transit from logic high to logic low. Before the power-on reset signal VCCHB transits from logic high to logic low, the input node of the inverter INV is electrically connected to the ground voltage node through the transistor T2. The output of the inverter INV is logic high, so that the transistor T3 is turned on. The output of the inverter INV is logic high, so that the input node of the inverter INV also is electrically connected with the ground voltage node through the transistor T3. If the power-on reset signal VCCHB is activated, the fuse line FL is connected with the input node of the inverter INV through the transistor T1.

If the fuse line FL is provided with the power Vint, in other words, if the fuse connected with the fuse line FL is not cut off, the power Vint is transmitted to the input node of the inverter INV. And then, the output of the inverter INV is logic low and the transistor T3 is turned off. That is, the fuse address information signal FAI may be maintained as logic low.

If the fuse line FL is not provided with the power Vint, in other words, if the fuse connected with the fuse line FL is cut off, the input node of the inverter INV is connected to the ground voltage node through the transistor T3. Thus, the fuse address information signal FAI may be maintained as logic high.

Figure 5:
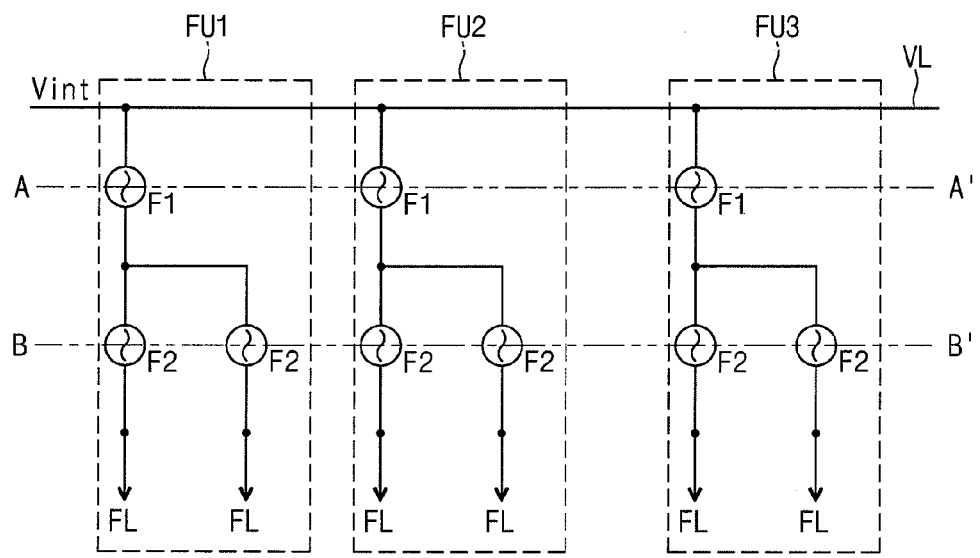
FIG. 5 is a schematic diagram illustrating one of the plurality of fuse boxes 521 to 52n shown in FIG. 2 according to a first embodiment of the present invention.

FIG. 5 is a schematic diagram illustrating one of the plurality of fuse boxes 521 to 52n shown in FIG. 2 according to an embodiment of the present invention. Referring to FIG. 5, the fuse box comprises a plurality of fuse units FU1 to FU3. The fuse units FU1 to FU3 are commonly connected to a power line VL provided with the power Vint. Each of the fuse units FU1 to FU3 includes a first fuse F1 and a plurality of second fuses F2. The first fuse F1 is connected with the power line VL provided with the power Vint. In each of the fuse units FU1 to FU3, the second fuses F2 are connected with the first fuse F1 in parallel and connected with corresponding fuse lines FL respectively.

Figure 6:
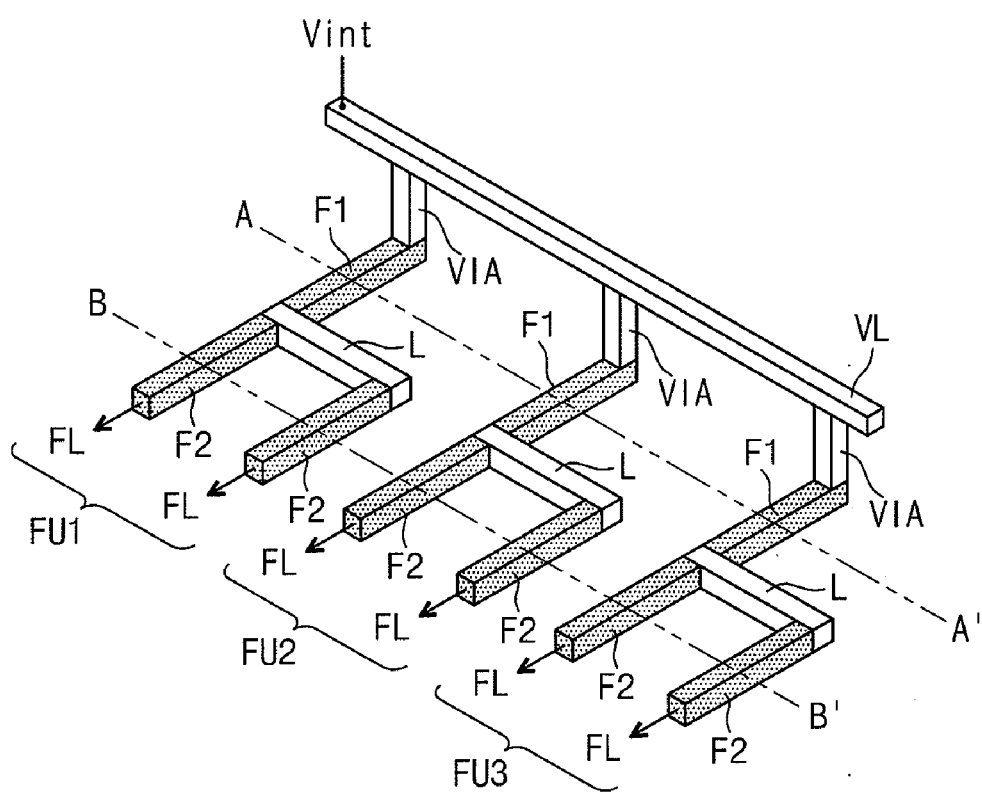
FIG. 6 is a diagonal view of the fuse box shown in FIG. 5.

FIG. 6 is a diagonal view of the fuse box shown in FIG. 5. Referring to FIG. 6, the fuse box comprises the power line VL supplied by the power Vint and the plurality of fuse units FU1 to FU3. The power line VL may be a metal. For example, the power line VL may be formed of tungsten, aluminum or copper. Each of the fuse units FU1 to FU3 includes the first fuse F1 and the plurality of second fuses F2. The first and second fuses F1 and F2 may be formed of a metal. For example, the fuses F1 and F2 may be formed of tungsten, aluminum or copper. The first and second fuses F1 and F2 may be formed of poly-silicon. A metal-silicide layer may be deposited on the poly-silicon. The metal-silicide layer may be a tungsten-silicide layer, a cobalt-silicide layer or a nickel-silicide layer. The first and second fuses F1 and F2 are formed on different layers, respectively. The power line VL is connected with the first fuses F1 through VIA. The VIA may be formed of a same material with the power line VL. The second fuses F2 are connected with the first fuse F1 in parallel through a wire L. The wire L may be formed of the same material with the first and second fuses F1 and F2. The second fuses F2 are connected with the corresponding fuse line FL respectively.

Referring to FIG. 5 and FIG. 6, the number of the fuse units FU1 to FU3 of the fuse box according to the first embodiment of the present invention is determined by the number of bits of the address stored in the fuse box. If the number of the fuse units is eight, an address stored in the fuse box is an eight-bit address. As shown in FIG. 5 and FIG. 6, if the number of the fuse units is three, the address stored in the fuse box is a three-bit address. Although three fuse units FU1 to FU3 are shown in FIG. 5 and FIG. 6, the number of fuse units of the fuse box according to the first embodiment of the present invention is not restricted. Each of the fuse units FU1 to FU3 of the fuse boxes may correspond to respective bits of the addresses stored in the fuse box. For example, first bits of the addresses stored in the fuse box correspond to the fuse unit FU1. Second bits of the addresses stored in the fuse box correspond to the fuse unit FU2. And, third bits of the addresses stored in the fuse box correspond to the fuse unit FU3.

The number of the second fuses F2 of the fuse box is determined by the number of the addresses stored in the fuse box. As shown in FIG. 5 and FIG. 6, if the number of the second fuses F2 is two, two addresses are stored in the fuse box. If the number of the second fuses F2 is n, n addresses are stored in the fuse box. Although two second fuses F2 are shown in FIG. 5 and FIG. 6, the number of the second fuses F2 of the fuse box is not restricted. Each of the second fuses F2 may correspond to each of the addresses stored in the fuse box. For example, a first bit of a first address of the addresses stored in the fuse box corresponds to a left fuse of the second fuses F2 of the fuse unit FU1. A first bit of a second address of the addresses stored in the fuse box corresponds to a right fuse of the second fuses F2 of the fuse unit FU1. Although terms 'left' and 'right' are used for concise description of the second fuses F2, locations and/or configurations of the second fuses F2 according to the present invention are not restricted to the terms 'left' and 'right'.

According to an embodiment of the present invention, in a case where a plurality of the second fuses F2 is cut off, the first fuse F1 is cut off instead of the second fuses F2. More particularly, in the case that all of the second fuses F2 connected with the fuse F1 in the same fuse unit must be cut off, the first fuse F1 is cut off instead of the second fuses F2. Thus, the number of cutting operations is reduced, so that time taken to cut fuses decreases.

Figure 7:
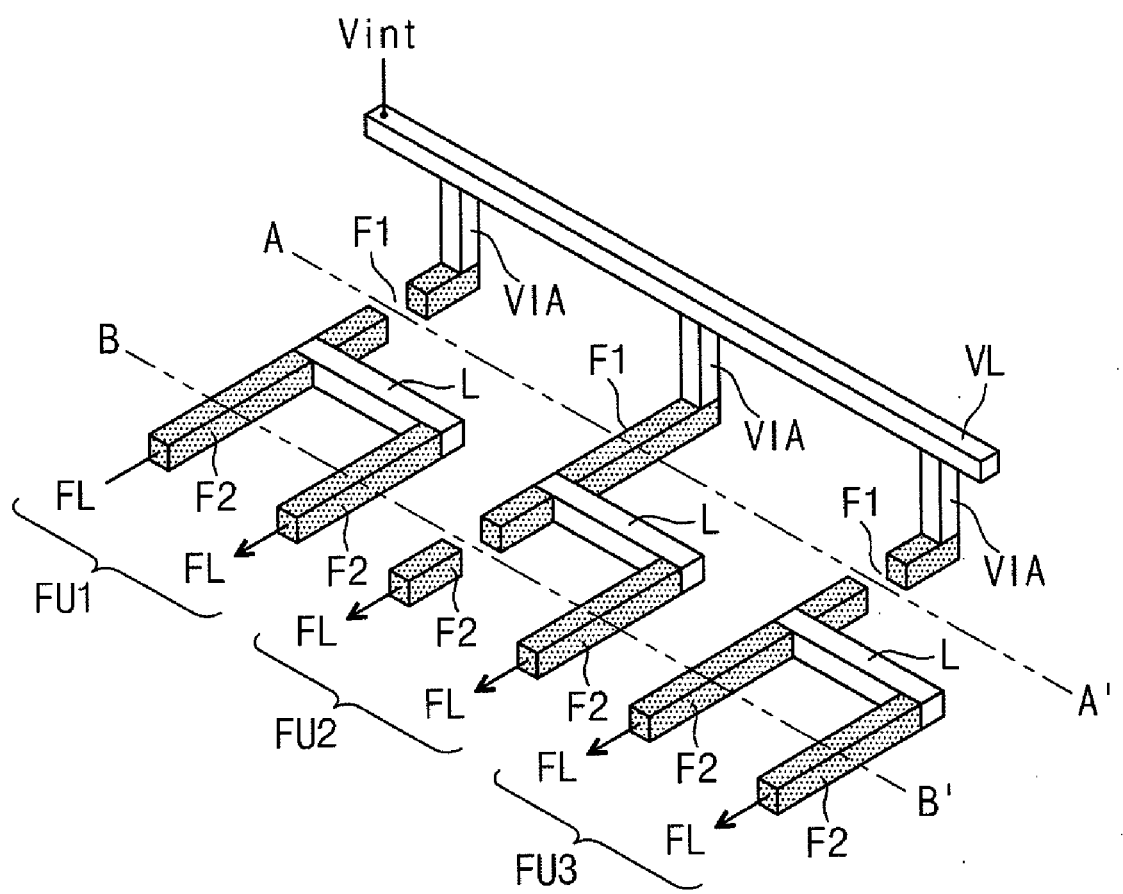
FIG. 7 is a diagonal diagram of the fuse box, shown in FIG. 6, which is cut off by a laser according to an embodiment of the present invention.

FIG. 7 is a diagonal diagram of the fuse box, shown in FIG. 6, which is cut off by a laser according to an embodiment of the present invention. It may be assumed that the first and the second addresses to be stored in the fuse box are '111' and '101' respectively. It also may be assumed that the cutting operations are performed when the address bit indicates "1". The number of the addresses to be stored in the fuse box is two, so that the number of the second fuses F2 is two. The number of bits of each of the addresses to be stored in the fuse box is three, so that the number of the fuse units is three. The first address corresponds to the left fuse of the second fuses F2 and the second address corresponds to the right fuse of the second fuses F2.

The first bits of the addresses correspond to the fuse unit FU1. The first bits of the addresses are the same as "1". Thus, all of the second fuses F2 of the fuse unit FU1 may be cut off At this time, the first fuse F1 of the fuse unit FU1 commonly connected to the second fuses F2 may be cut instead of the second fuses F2.

The second bits of the addresses correspond to the fuse unit FU2. The second bits of the addresses are 1 and 0 respectively. The left fuse of the second fuses F2 of the fuse unit FU2, which corresponds to the second bit of the first address of the addresses, may be cut off. The right fuse of the second fuses F2 of the fuse unit FU2, which corresponds to the second bit of the second address of the addresses, may not be cut off.

The third bits of the addresses correspond to the fuse unit FU3. The third bits of the addresses are the same as "1". Thus, all of the second fuses F2 of the fuse unit FU3, which correspond to the third bits of the addresses, may be cut off. At this time, the first fuse F1 of the fuse unit FU3 commonly connected to the second fuses F2 may be cut off instead of the second fuses F2.

The cutting operations are performed along the same axis. First, the first fuses F1 of the fuse units FU1 to FU3 are cut off along a line A to A'. And then, the second fuses F2 of the fuse units FU1 to FU3 are cut off along a line B to B'. That is, the number of the cutting operations is determined by the number of columns of the first and second fuses F1 and F2 along the same axis. Thus, two cutting operations are required for cutting the fuses of the fuse box shown in FIG. 3 and FIG. 4.

Thus, when all of the second fuses F2 of each of the fuse units FU1 to FU3 are cut off, the first fuse F1 commonly connected to the second fuses F2 is cut off instead of the second fuses F2. Thus, the time for the cutting operations decreases. Referring to a result of a simulation of the cutting operations about a wafer having, for example, 2,200 dies, the time for the cutting operations is reduced from 454 seconds to 352 seconds in 2,196 dies. In other words, the time for the cutting operations is reduced by 23%.

Figure 8:
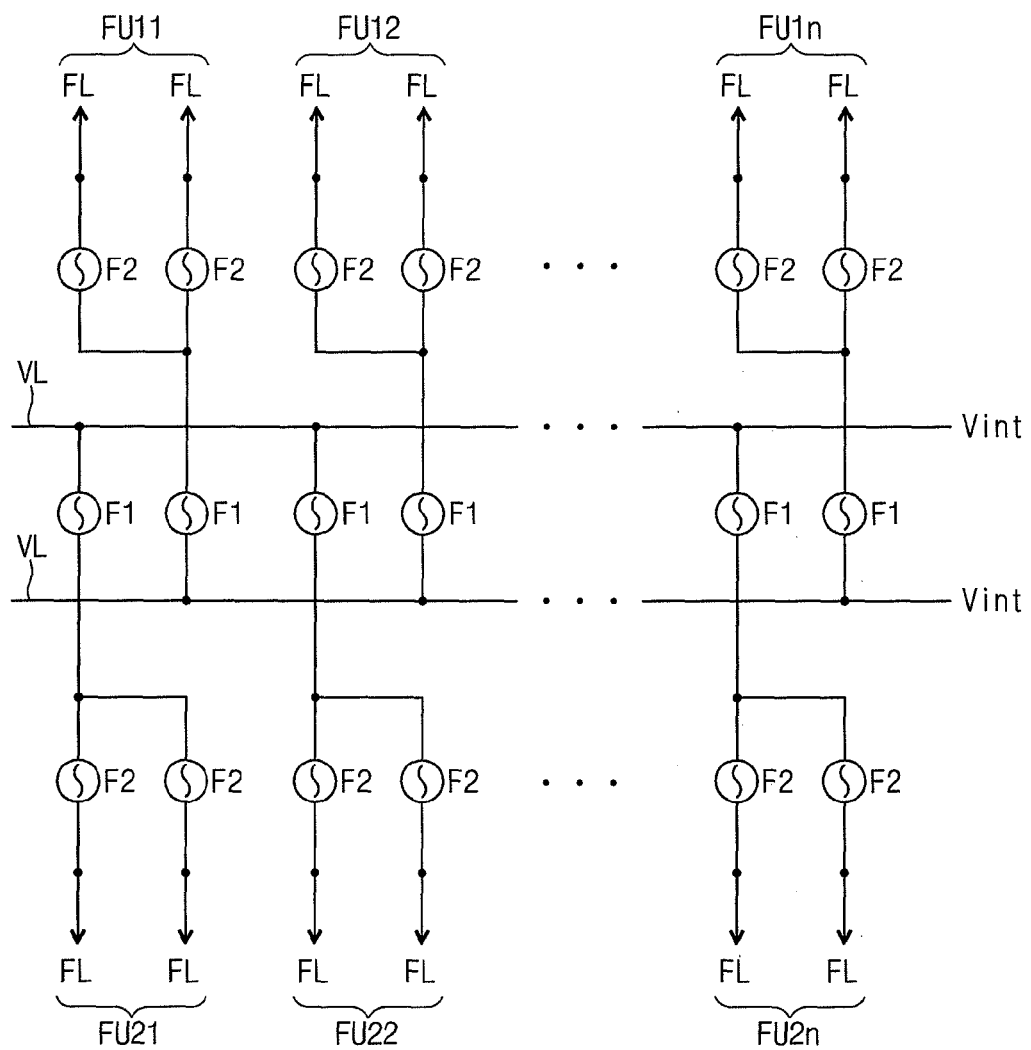
FIG. 8 is a schematic diagram illustrating a fuse box according to a second embodiment of the present invention.

FIG. 8 is a schematic diagram illustrating a fuse box according to a second embodiment of the present invention. The fuse box is resulting from a combination of two fuse boxes shown in FIG. 5 and FIG. 6. Referring to FIG. 8, the fuse box according to the second embodiment of the present invention comprises power lines VL and a plurality of fuse units FU11 to FU1n and FU21 to FU2n. The fuse units FU11 to FU1n and FU21 to FU2n are connected to the corresponding power lines VL commonly. Each of the fuse units FU11 to FU1n and FU21 to FU2n includes a first fuse F1 and second fuses F2. The first fuse F1 is connected with the corresponding power line VL. The second fuses F2 are connected with the fuse F1 in parallel. Each of the second fuses F2 is connected with the corresponding fuse line FL. The fuse units FU11 to FU1n store two of the addresses. The fuse units FU21 to FU2n store two different addresses. Thus, the fuse box according to the second embodiment of the present invention stores four addresses.

Figure 9:
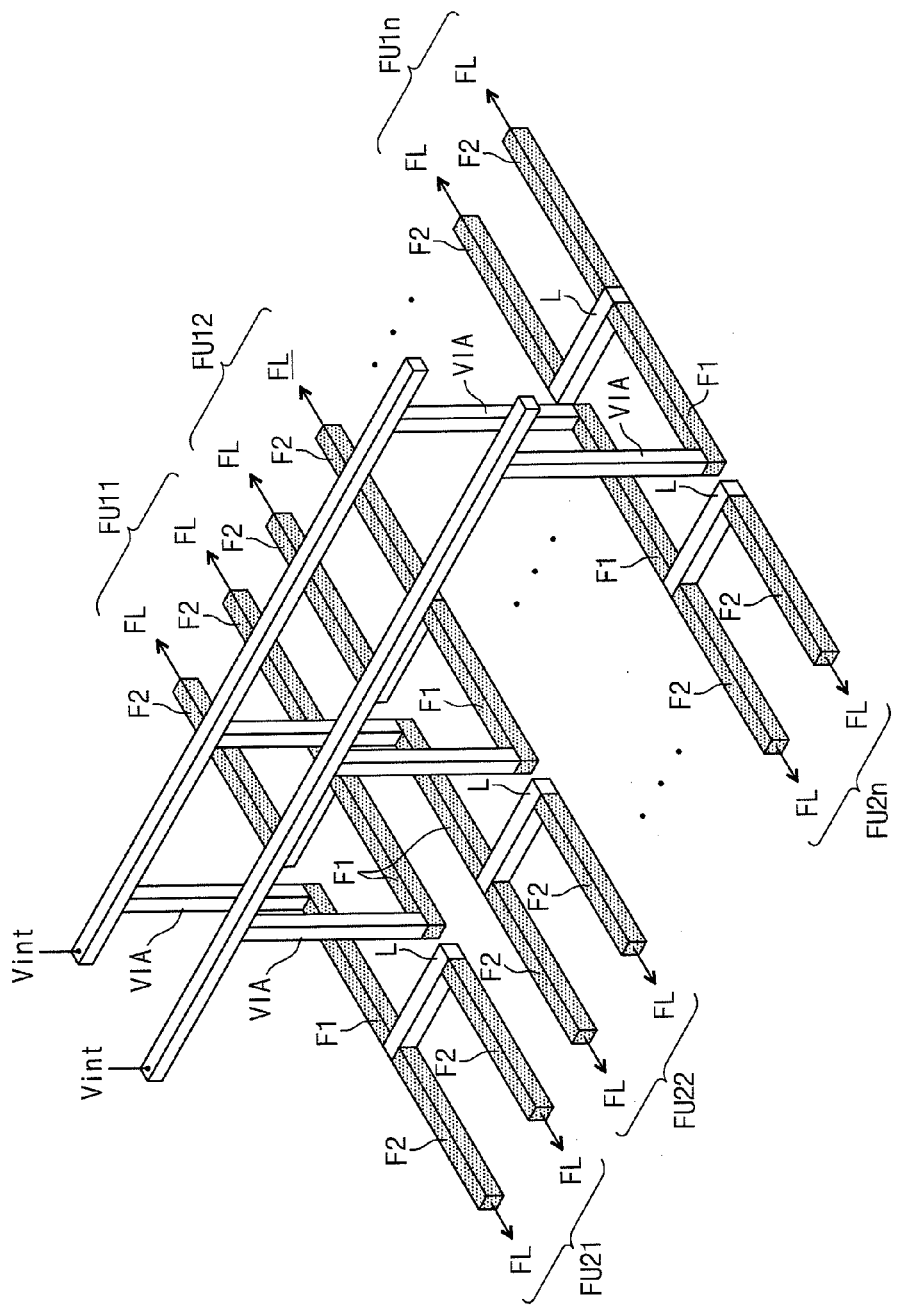
FIG. 9 is a diagonal diagram illustrating the fuse box shown in FIG. 8.

FIG. 9 is a diagonal diagram illustrating the fuse box shown in FIG. 8. Referring to FIG. 9, the fuse box includes the power lines VL and the plurality of fuse units FU11 to FU1n and FU21 to FU2n. The fuse units FU11 to FU1n and FU21 to FU2n are connected with the corresponding power lines VL commonly. Each of the fuse units FU11 to FU1n and FU21 to FU2n includes a first fuse F1 and second fuses F2. The power lines VL and the first and second fuses F1 and F2 may be formed on different layers. The first fuse F1 is connected with the corresponding power line VL through the VIA. The second fuses F2 are connected with the first fuse F1 in parallel through a wire L. Each of the second fuses F2 is connected to the corresponding fuse line FL.

Returning to FIG. 5 and FIG. 6, one of the fuse boxes stores two addresses. Two fuse boxes may store four addresses. The first and second fuses F1 and F2 of each of the fuse boxes are arranged in two columns along the same axis. The first and second fuses F1 and F2 of two fuse boxes may be arranged in four columns along the same axis. Thus, four cutting operations may be required for storing four addresses.

Returning to FIG. 8 and FIG. 9, each of the fuse boxes stores four addresses. Moreover, the first and second fuses F1 and F2 of each of the fuse boxes are arranged in three columns along the same axis. Thus, three cutting operations may be required for storing four addresses.

Figure 10:
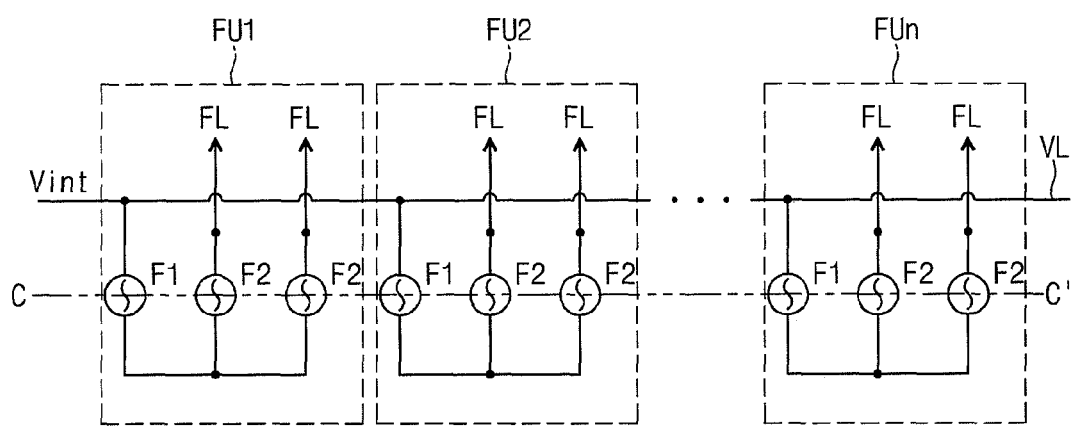
FIG. 10 is a schematic diagram illustrating the fuse box according to a third embodiment of the present invention.

FIG. 10 is a schematic diagram illustrating the fuse box according to a third embodiment of the present invention. Referring to FIG. 10, the fuse box comprises a power line VL provided with the power Vint and a plurality of fuse units FU1 to FUn. Each of the fuse units FU1 to FUn includes a first fuse F1 and second fuses F2. The first fuse F1 is connected with the power line VL. The second fuses F2 are connected with the first fuse F1 in parallel. Each of the second fuses F2 is connected with the corresponding fuse line FL. The number of the second fuses F2 of each of the fuse units FU1 to FUn is two, so that the fuse box stores two addresses. The number of the fuse units FU1 to FUn is n, so that each of the fuse units FU1 to FUn stores an n-bit address. Although two second fuses F2 are shown in each of the fuse units FU1 to FUn in FIG. 10, the number of the second fuses F2 in each of the fuse units is not restricted. The number of the second fuses F2 in each of the fuse units FU1 to FUn may be determined by the number of the addresses stored in the fuse box.

Figure 11:
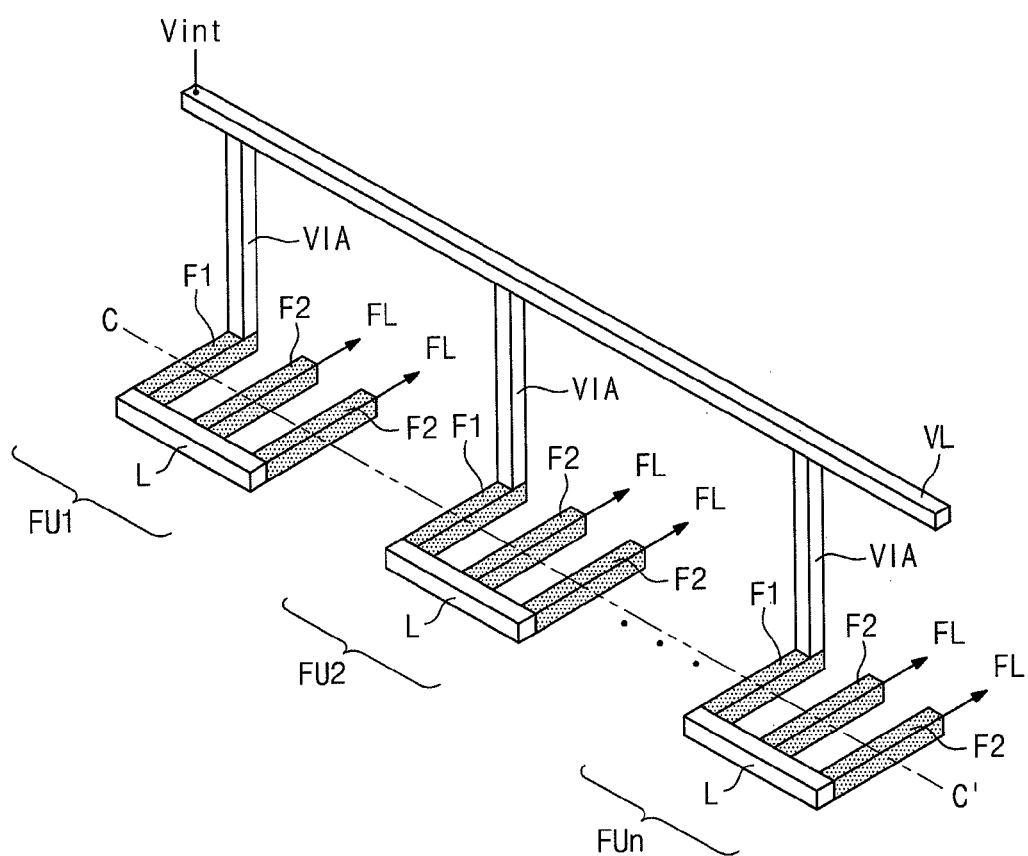
FIG. 11 is a diagonal diagram illustrating the fuse box shown in FIG. 11.

FIG. 11 is a diagonal diagram illustrating the fuse box shown in FIG. 11. Referring to FIG. 11, the fuse box comprises the power line VL provided with the power Vint and the plurality of the fuse units FU1 to FUn. The Fuse units FU1 to FUn are connected to the power line VL commonly. Each of the fuse units FU1 to FUn includes the first fuse F1 and the second fuses F2. The power line VL and the first and second fuses F1 and F2 may be formed on different layers, respectively. The first fuse F1 is connected with the power line VL through VIA. The second fuses F2 are connected with the fuse F1 in parallel through the wires L. The second fuses F2 are connected with the corresponding fuse line FL respectively.

Referring to FIG. 10 and FIG. 11, the first and second fuses F1 and F2 are arranged along a cutting-plane line C-C'. That is, the first and second fuses F1 and F2 are arranged in a column along the same axis, so that the cutting operation of the fuse box may be performed in one time. Thus, the time for the cutting operations may be reduced.

Figure 12:
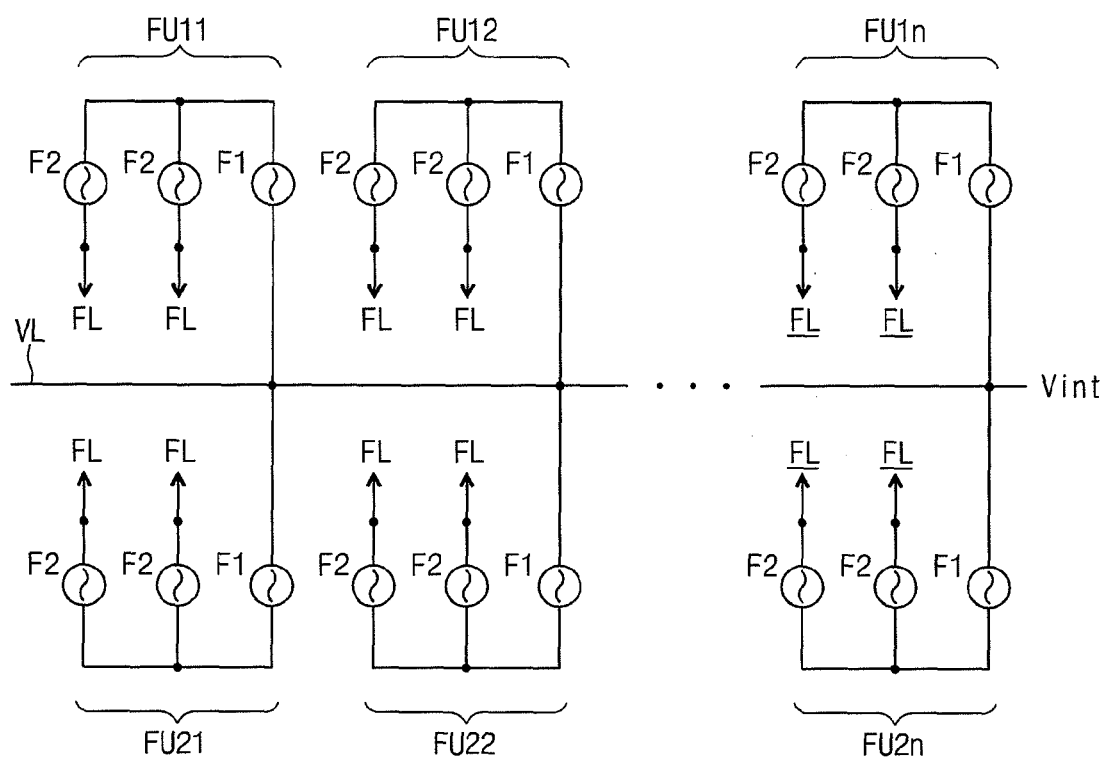
FIG. 12 is a schematic diagram illustrating a fuse box according to a fourth embodiment of the present invention.

FIG. 12 is a schematic diagram illustrating a fuse box according to a fourth embodiment of the present invention. The fuse box shown in FIG. 12 is resulting from a combination of two fuse boxes shown in FIG. 10 and FIG. 11. Referring to FIG. 12, the fuse box comprises the power line VL provided with the power Vint and a plurality of fuse units FU11 to FU1n and FU21 to FU2n. The fuse units FU11 to FU1n and Fu21 to FU2n are connected with the power line VL commonly. Each of the fuse units FU11 to FU1n and FU21 to FU2n includes a first fuse F1 and second fuses F2. The first fuse F1 is connected with the power line VL. The second fuses F2 are connected with the first fuse F1 in parallel. The second fuses F2 are connected with the corresponding fuse line FL respectively. The fuse units FU11 to FU1n may store two of the addresses. The fuse units FU21 to FU2n may store two different addresses. Thus, the fuse box stores four addresses.

Figure 13:
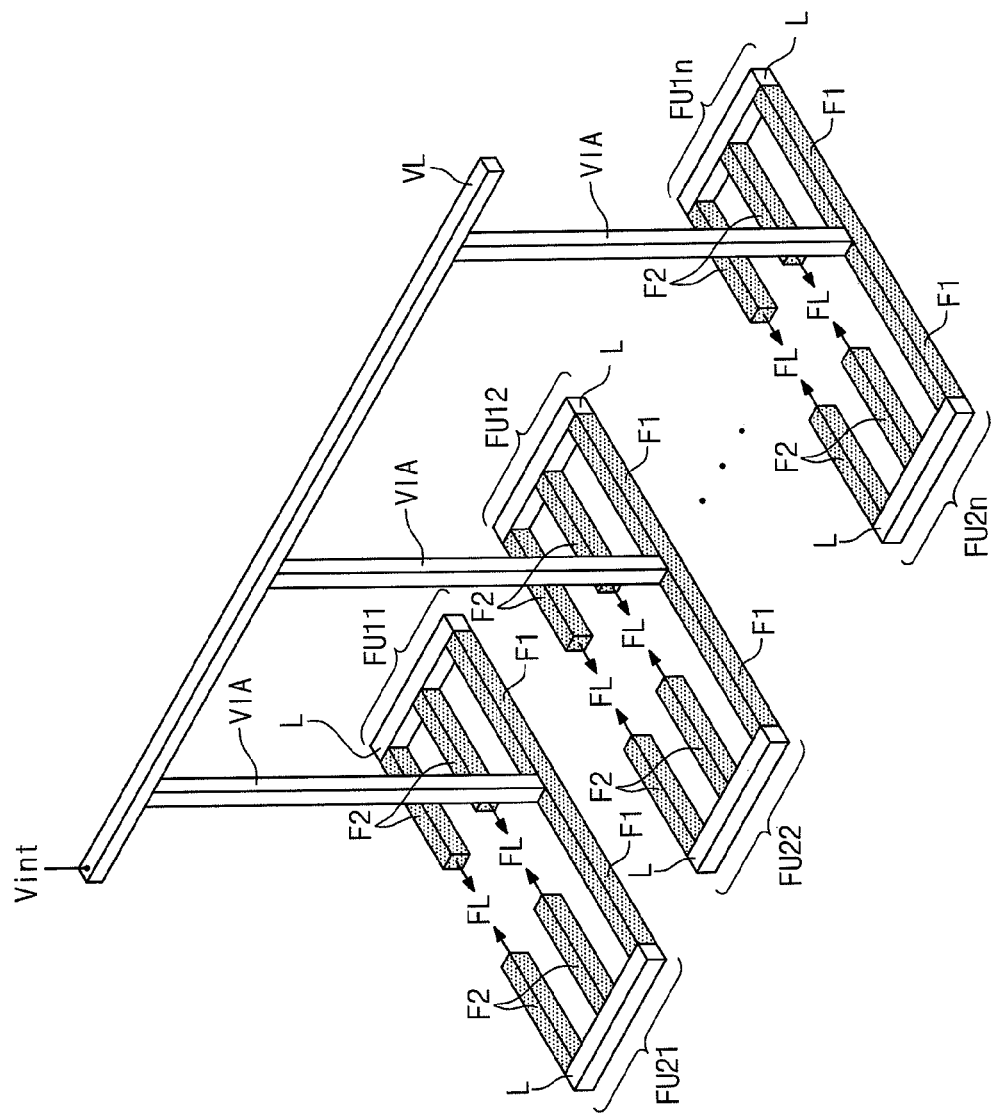
FIG. 13 is a diagonal diagram illustrating the fuse box shown in FIG. 12.

FIG. 13 is a diagonal diagram illustrating the fuse box shown in FIG. 12. Referring to FIG. 13, the fuse box comprises the power line VL provided with the power Vint and the plurality of fuse units FU11 to FU1n and FU21 to FU2n. Each of the fuse units FU11 to FU1n and FU21 to FU2n includes the first and second fuses F1 and F2. The power line VL and the first and second fuses F1 and F2 may be formed in different layers, respectively. The first fuse F1 is connected with the power line VL through VIA. The second fuses F2 are connected with the first fuse F1 in parallel. The second fuses F2 are connected with the corresponding fuse line FL respectively.

Referring to FIG. 12 and FIG. 13, the first and second fuses F1 and F2 are arranged in two columns along the same axis, so that the cutting operation of the fuse box may be performed in two times.

Figure 14:
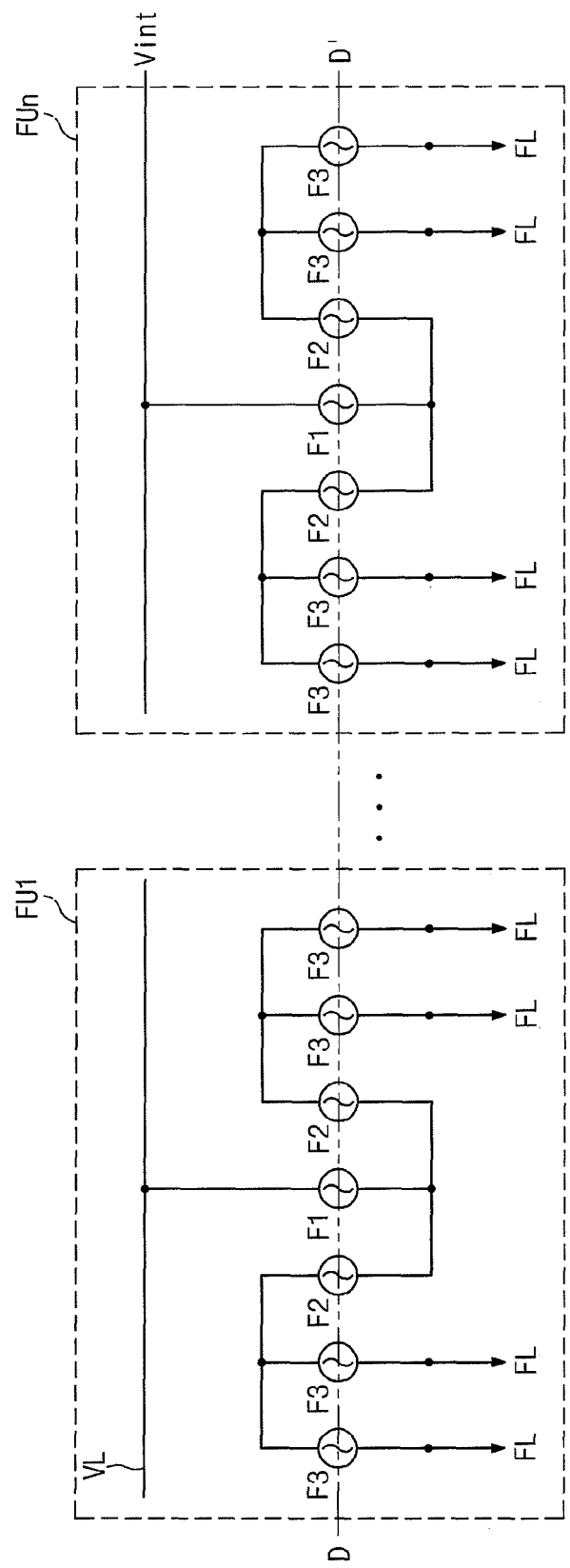
FIG. 14 is a schematic diagram illustrating a fuse box according to fifth embodiment of the present invention.
Figure 15:
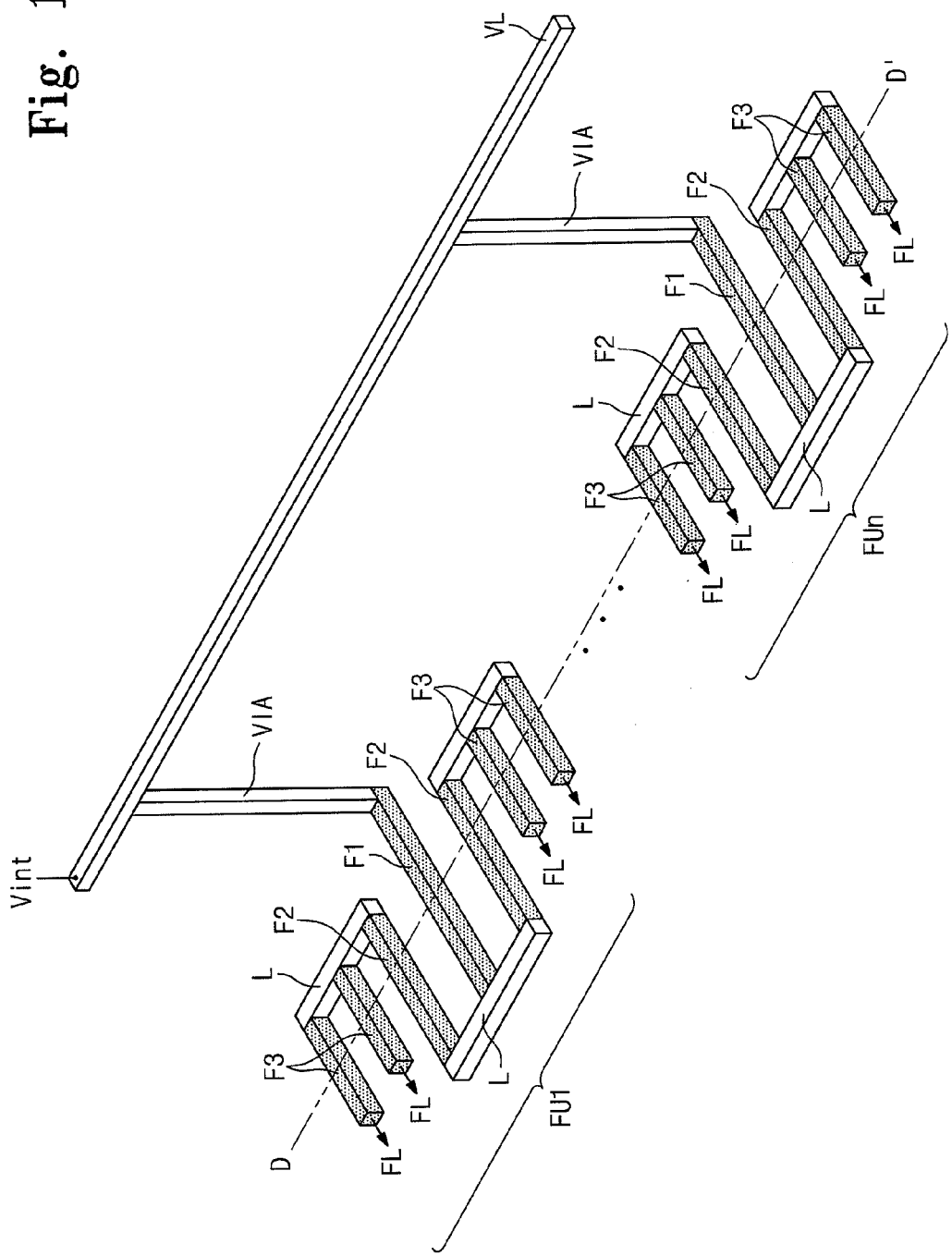
FIG. 15 is a diagonal diagram illustrating the fuse box shown in FIG. 14.

FIG. 14 is a schematic diagram illustrating a fuse box according to fifth embodiment of the present invention. Referring to FIG. 14, the fuse box according to the fifth embodiment of the present invention comprises the power line VL provided with the power Vint and a plurality of fuse units FU1 to FUn. The fuse units FU1 to FUn are connected with the power line VL commonly. Each of the fuse units FU1 to FUn includes a first fuse F1 and second fuses F2 and third fuses F3. The first fuse F1 is connected to the power line. The second fuses F2 are connected with the first fuse F1 in parallel. The third fuses F3 are divided into groups of which number is the same as the number of the second fuses F2. The third fuses F3 in each of the groups are connected with the corresponding second fuse F2 in parallel. The third fuses F3 is connected with the corresponding fuse line FL respectively. The number of the fuse units FU1 to FUn is determined by the number of bits of the address stored in the fuse box. The number of the fuse units FU1 to FUn is n, so that the addresses stored in the fuse box are n-bit addresses. Each of the fuse units FU1 to FUn corresponds to each of the bits of the addresses stored in the fuse box. For example, the fuse unit FU1 corresponds to first bits of the addresses stored in the fuse box. The fuse unit FUn corresponds to n-th bits of the addresses stored in the fuse box. The number of the third fuses F3 in each of the fuse units FU1 to FUn is determined by the number of the addresses stored in the fuse box. The number of the third fuses F3 shown in FIG. 14 is four, so that the fuse box stores four addresses. Each of the third fuses F3 corresponds to each of the addresses stored in the fuse box respectively. FIG. 15 is a diagonal diagram illustrating the fuse box shown in FIG. 14. Referring to FIG. 15, the fuse box comprises the power line provided with the power Vint and the plurality of fuse units FU1 to FUn. Each of the fuse units FU1 to FUn includes the first, second and third fuses F1, F2 and F3. The power line VL and the first, second and third fuses F1, F2, and F3 are formed in different layers. The first fuse F1 is connected with the power line through VIA. The second fuses F2 are connected with the first fuse F1 in parallel through wires L. The third fuses F3 are divided into groups of which number is the same as the number of the fuses F2. The third fuses F3 in each of the groups are connected with the corresponding second fuse F2 in parallel through wires L. The third fuses F3 are connected with the corresponding fuse line FL respectively.

Referring to FIG. 14 and FIG. 15, each of the third fuses F3 may be cut off if the corresponding bit of the corresponding address indicates 1 or 0. In a case where all of the third fuses F3 commonly connected with one of the second fuses F2 must be cut off, the second fuse F2 is cut off instead of the third fuses F3 commonly connected with the second fuse F2. In the case that all of the second fuses F2 commonly connected with the fuse F1 must be cut off, the first fuse F1 is cut off instead of the second fuses F2 commonly connected to the fuse F1.

For example, it may be assumed that four addresses are stored in the fuse box and that first bits of the addresses are the same as "1". It also may be assumed that each of the third fuses F3 is cut off if a corresponding address bit indicates "1". First bits of the addresses are the same as "1", so that all of the third fuses F3 in the fuse unit FU1 may be cut off. All of the third fuses F3 connected with the second fuses F2 may be cut off, so that the second fuses F2 may be cut off instead of the third fuses F3. All of the second fuses F2 connected with the first fuse F1 may be cut off, so that the first fuse F1 may be cut off instead of the second fuses F2. Thus, the number of fuses to be cut off is reduced.

The first, second and third fuses F1, F2 and F3 are arranged along a line D to D'. That is, the first, second and third fuses F1, F2 and F3 are arranged in a column along the same axis. Thus, the first, second and third fuses F1, F2 and F3 are cut off by one cutting operation.

The fuse box according to the present invention comprises the first fuse F1 connected with the power line VL and the second fuses F2 connected to the first fuse F1 in parallel. The first fuse F1 is cut off instead of the second fuses F2 in a case where all of the second fuses F2 have to be cut off. Thus, the time for the cutting operations may be reduced.

Figure 16:
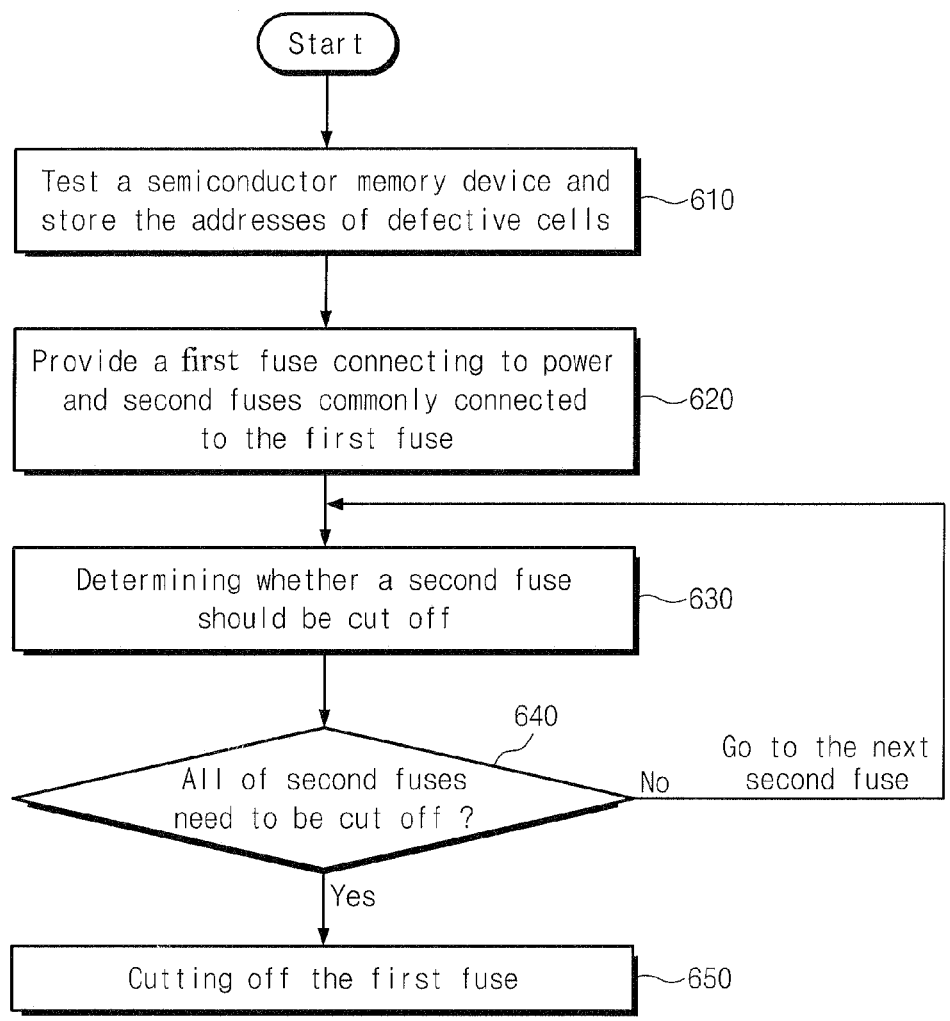
FIG. 16 is a flow chart of a method of cutting fuses in a memory device.

FIG. 16 is a flow diagram of a method of cutting fuses in a memory device. A test for detecting the defective memory cells is performed and addresses of cells determined as defected cells by the test are stored into the fuse box circuit 52 (step 610). A plurality of fuse units connected with a power line commonly, each of the fuse units comprising a first fuse connected with the power line; and a plurality of second fuses connected with the first fuse (step 620). A fuse decoders FD decodes the fuse address information signal FAI indicating whether the corresponding fuse is to be cut off (step 630). Then the number of the second fuses to be cut off is determined (step 640). In a case where a plurality of the second fuses F2 is cut off, the first fuse F1 is cut off instead of the second fuses F2. According to one embodiment of the present invention, when all of the second fuses F2 connected with the fuse F1 in the same fuse unit are to be cut off (step 650), the first fuse F1 is cut off instead of the second fuses F2 (step 660). According to an alternative embodiment, the first fuse is cut instead of the second fuses when the number of second fuses to be cut exceeds a threshold, such as 80% of the total number of second fuses. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A fuse box for use in a semiconductor memory device, comprising:
    a plurality of fuse units connected to a common power line, each of the fuse units comprising:
    a first fuse having a first electrode connected to the power line, a second electrode, and a cutting region in between; and
    a plurality of second fuses each having a first electrode, a second electrode and a cutting region in between with their first electrodes connected to the second electrode of the first fuse, and each of the second electrode adapted to be connected to a corresponding addressable memory cell,
    wherein if the second fuses are determined to be cut off, the first fuse is cut off instead of the second fuses.

2. The fuse box of claim 1, further comprising a plurality of third fuses each having a first electrode, a second electrode and an cutting region in between with its first electrode connected to a second electrode of a second fuse, and each of the second electrodes adapted to be connected to a corresponding addressable memory cell,
    wherein if each of the third fuses connected with the second fuse are determined to be cut off, the second fuse is cut off instead of the third fuses.

3. The fuse box of claim 1, wherein the cutting regions of the first and second fuses are arranged in a column along a single axis.

4. A semiconductor memory device comprising:
    a memory cell array having a normal cell array and a redundant cell array; and
    a redundant selection circuit configured to receive an address from an exterior and to select the redundant cell array if the received address indicates the defected cells,
    wherein the redundant selection circuit comprises a plurality of fuse boxes for storing addresses of the defected cells,
    wherein each of the fuse boxes comprises a plurality of fuse units, each of the fuse units comprises: a first fuse connected with a power line, and a plurality of second fuses connected commonly with the first fuse; and
    wherein if the second fuses are determined to be cut off, the first fuse is cut off instead of the second fuses.

5. The semiconductor memory device of claim 4, wherein each of the fuse boxes stores two or more addresses of the defected cells.

6. The semiconductor memory device of claim 5, wherein the number of the second fuses is determined by the number of the addresses of the defected cells stored in each of the fuse boxes, and each of the second fuses corresponds to each of the addresses of the defective cells stored in each of the fuse boxes.

7. The semiconductor memory device of claim 6, wherein the number of the fuse units is determined by the number of bits of the addresses of the defective cells stored in each of the fuse boxes, and each of the fuse units corresponds to each of the bits.

8. The semiconductor memory device of claim 4, wherein cutting regions of the first and second fuses are arranged in a column along a same axis.

9. The semiconductor memory device of claim 4, further comprising:
- a plurality of third fuses, each having a first electrode, a second electrode and an cutting region in between with their first electrodes connected to the second electrode of a second fuse, and each of their second electrodes adapted to be connected to a corresponding addressable memory cell,
- wherein if each of the third fuses connected with the second fuse are determined to be cut off, the second fuse is cut off instead of the third fuses.

10. The semiconductor memory device of claim 9, wherein the number of the third fuses is determined by the number of the addresses of the defective cells stored in each of the fuse boxes, and each of the third fuses corresponds to each of the addresses of the defective cells stored in each of the fuse boxes.

11. The semiconductor memory device of claim 10, wherein the number of the fuse units is determined by the number of bits of the addresses of the defective cells stored in each of the fuse boxes, and each of the fuse units corresponds to each of the bits.

12. A method of cutting fuses in a memory device, comprising:
- storing addresses of defective cells;
- providing a plurality of fuse units, each comprising a first fuse connected to a common power line, and a plurality of second fuses commonly connected to the first fuse, and individually connected to a corresponding memory cell,
- identifying which of the fuses are to be cut off based on the address of defective cells; and
- upon determining that a plurality of the second fuses are to be cut off, cutting off the first fuse.

13. The method of claim 12, wherein the step of determining further comprises if the number of the second fuses to be cut off is larger than a threshold, cut off the first fuse.

14. The method of claim 13, wherein the threshold is all of the second fuses.

15. The method of claim 12, wherein the step of cutting the fuses comprises cutting a plurality of fuses arranged along a single axis.

* * * * *